US007117400B2

(12) United States Patent
Batson et al.

(10) Patent No.: US 7,117,400 B2
(45) Date of Patent: Oct. 3, 2006

(54) MEMORY DEVICE WITH DATA LINE STEERING AND BITLINE REDUNDANCY

(75) Inventors: Kevin A. Batson, Williston, VT (US); Robert E. Busch, Essex Junction, VT (US); Garrett S. Koch, Jeffersonville, VT (US); Fred J. Towler, Essex Junction, VT (US); Reid A. Wistort, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 10/065,723

(22) Filed: Nov. 13, 2002

(65) Prior Publication Data

US 2004/0153899 A1 Aug. 5, 2004

(51) Int. Cl.
*G06F 11/20* (2006.01)
*G11C 11/4094* (2006.01)
*G11C 15/00* (2006.01)
*G11C 15/04* (2006.01)

(52) U.S. Cl. .................. 714/711; 365/49; 365/200

(58) Field of Classification Search ............... 365/200, 365/49; 714/710, 711
See application file for complete search history.

(56) References Cited

U.S. PATENT DOCUMENTS

| 4,587,639 | A | * | 5/1986 | Aoyama et al. ............ 365/200 |
| 4,598,388 | A | * | 7/1986 | Anderson ................... 365/200 |
| 4,639,898 | A | * | 1/1987 | Sauer ......................... 365/202 |
| 5,134,585 | A | * | 7/1992 | Murakami et al. .......... 365/200 |
| 5,301,153 | A | * | 4/1994 | Johnson ...................... 365/200 |
| 5,319,589 | A | * | 6/1994 | Yamagata et al. .......... 365/200 |
| 5,499,211 | A | * | 3/1996 | Kirihata et al. ............. 365/203 |
| 5,771,194 | A | * | 6/1998 | Maeno ........................ 365/200 |
| 5,796,662 | A | * | 8/1998 | Kalter et al. ................ 365/200 |
| 6,665,220 | B1 | * | 12/2003 | Vlasenko ..................... 365/200 |
| 6,714,430 | B1 | * | 3/2004 | Srinivasan et al. ........... 365/49 |

* cited by examiner

*Primary Examiner*—Stephen M. Baker
(74) *Attorney, Agent, or Firm*—Schmeiser, Olsen & Watts; Anthony Canale

(57) ABSTRACT

An integrated circuit including: a set of bitlines; a set of data lines; means for coupling each respective data line to a first respective bitline or to a second respective bitline based on a steering signal, the second respective bitline being adjacent to the first respective bitline; and means for maintaining the first respective bitline at a desired potential after the data line is coupled to the second bitline.

26 Claims, 6 Drawing Sheets

MEMORY DEVICE WITH DATA LINE STEERING AND BITLINE REDUNDANCY

BACKGROUND OF THE INVENTION

1. Field of the Invention

The present invention relates generally to integrated circuit devices and more specifically to integrated circuit memory devices with redundant memory cells for replacing defective memory cells.

2. Background of the Invention

Integrated circuit memory devices comprise arrays of memory cells arranged in rows and columns. Generally, memory cells in each row of the array are tied to a common wordline and memory cells in each column of the array are tied to a common bitline. The bitlines are used to write and read data into the memory cells and the wordlines are used to select which memory cells along a given bitline the data is written into.

When a memory cell fails, the entire bitline that the failing cell is attached is no longer useable. In order to increase yield and reduce cost, memory devices are often provided with redundant bitlines. A test is performed and defective memory cells and the bitlines they are attached to determined. Then the failing bitline is "disconnected" from the array and replaced with a non-defective spare or redundant bitline. This replacement requires that data originally intended for the failing bitline, be "steered" to the replacement bitline.

While many schemes have been developed for steering data to redundant bitlines, they all share the same problem in that they leave a data line feeding the failing bitline floating. This problem is of particular concern in certain memory devices, for example, such as content addressable memories (CAMs) where floating data lines can lead to erroneous address information being passed out of the CAM. Therefore, there is a need for a technique of replacing bitlines that overcomes the potential problem caused by floating data lines.

SUMMARY OF THE INVENTION

A first aspect of the present invention is an integrated circuit comprising: a set of bitlines; a set of data lines; means for coupling each respective data line to a first respective bitline or to a second respective bitline based on a steering signal, the second respective bitline being adjacent to the first respective bitline; and means for maintaining the first respective bitline at a desired potential after the data line is coupled to the second bitline.

A second aspect of the present invention is a method of replacing, in an integrated circuit having a multiplicity of data lines and a multiplicity of bitlines, a first bitline with a second bitline comprising: providing a set of the multiplicity of the bitlines; providing a set of the multiplicity of the data lines; coupling each respective data line to a first respective bitline or to a second respective bitline based on a steering signal, the second respective bitline being adjacent to the first respective bitline; and maintaining the first respective bitline at a desired potential after the data line is coupled to the second bitline.

A third aspect of the present invention is a content addressable memory comprising: a set of bitlines; a set of data lines, a number of the data lines less than a number of the bitlines; a set of read lines, a number of the read lines equal to the number of the data lines, each read line coupled to one corresponding bitline of the set of bitlines; means for coupling each respective data line to a first respective bitline or to a second respective bitline based on a steering signal, the second respective bitline being adjacent to the first respective bitline; means for directing a first respective read line coupled to the first respective bitline to a second respective read line coupled to the second respective bitline in response to the steering signal; and means for maintaining the first respective bitline at a known fixed state after the data line is coupled to the second bitline.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
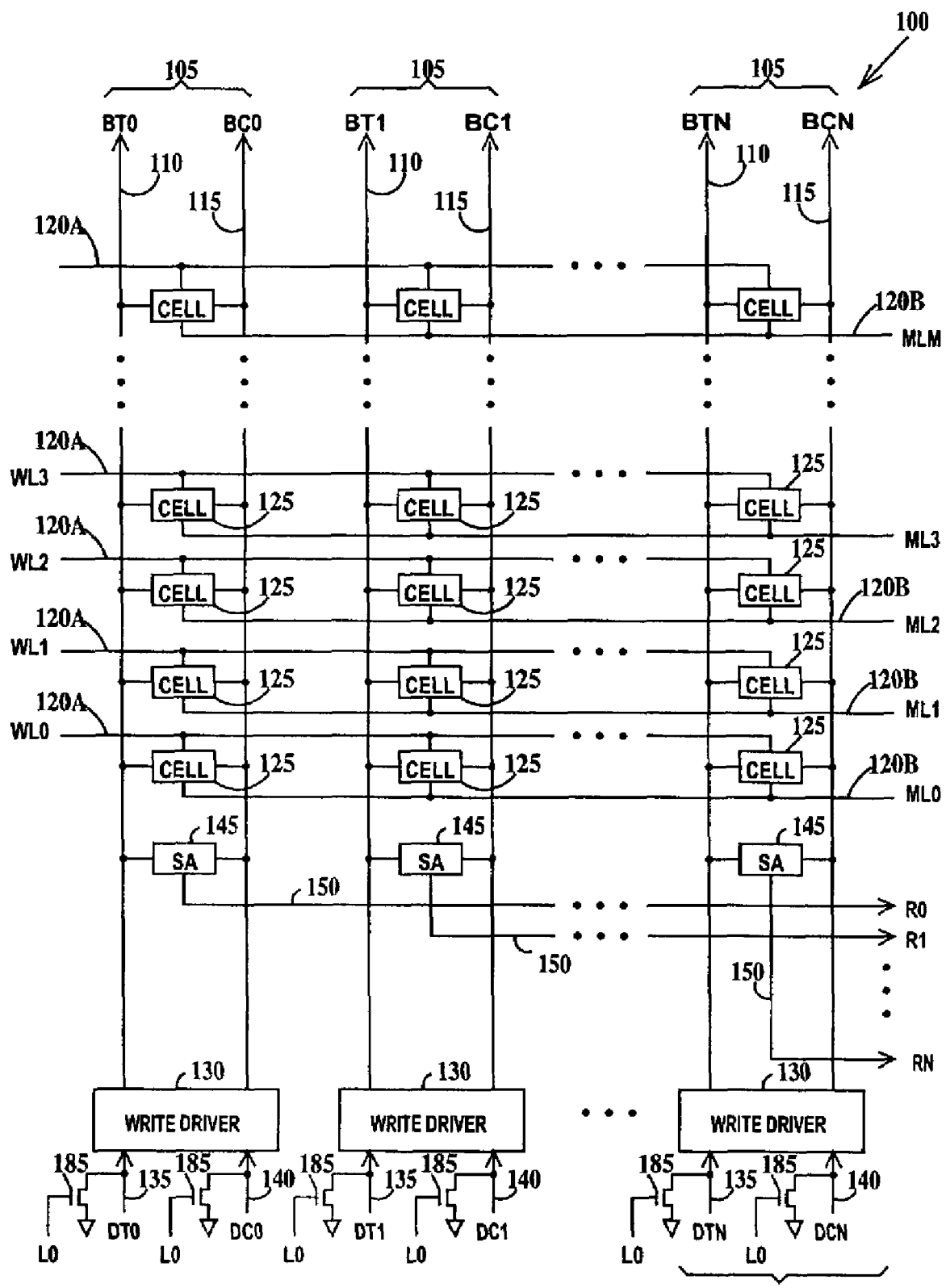
FIG. 1 is schematic diagram of an exemplary CAM according to the present invention.

FIG. 1 is schematic diagram of an exemplary CAM according to the present invention. In FIG. 1, CAM 100 includes a multiplicity of bitline pairs 105, each bitline pair including a true bitline 110 and a complement bitline 115, and a multiplicity of wordlines 120A and match lines 120B, orthogonal to the bitlines. Coupled between each true bitline and complement bitline 115 are a multiplicity of memory cells 125. Each memory cell includes a memory portion for storing data and comparator portion for sensing the data stored in the memory portion. Each memory cell 125 is also coupled to one of wordlines 120A and one of match lines 120B. In one example memory cells 125 are static random access memory (SRAM) cells. Coupled between each bitline pair 105 is a sense amplifier 145. Each bitline pair is coupled to a write driver 130. Each write driver 130 is also coupled to a data true line 135 and a data complement line 140. Thus, there is a corresponding data true line 135 for each true bitline 110 and a corresponding data complement line 140 for each complement bitline 115. Data true lines 135 and data complement lines 140 also serve as search lines. Each sense amplifier produces a single-ended output on a read line 150.

Data is written to CAM 100 by write drivers 130 writing data to bitline pairs 105 and activating selected wordlines 120 to determine which memory cells 125 the data is written to. Data is read out of CAM 100 by activating selected wordlines 120 and sensing the differential voltage on each bitline pair 105 and outputting the data state on read lines 150. It is critical to the "search" operation of CAM 100 that bitline pairs 105 are at a known state, i.e. not floating. If a bitline is floating, then the memory cells coupled to the floating bitline will also be floating. The detector portion of a floating memory cell passes that floating state on to the match line, producing a match one time and a no-match the second time. To avoid this situation each true bitline 110, each complement bitline 115 and each read line 150 is coupled to a pull down device 185 controlled through a switching network as illustrated respectively in FIGS. 2A and 2B and described infra.

The last true bitline 110 (labeled BTN) is a redundant true bitline, the last complement bitline 115 (labeled BCN) is a redundant complement bitline and the last read line 150 (labeled RN) is a redundant read line.

In CAM 100, search data is coupled to data true lines 135 and data complement lines 140. CAM 100 operates by writing a search word onto the search lines and determining the matchline 120B where all the bits match.

Figure 2A:
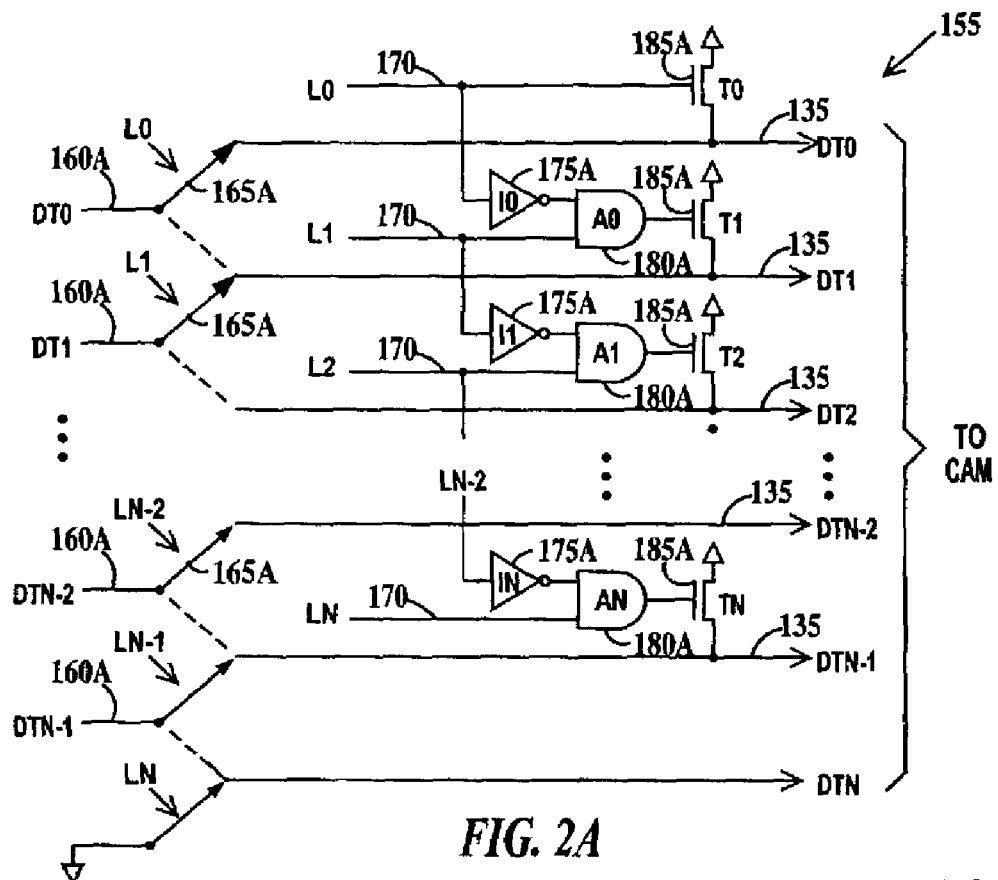
FIG. 2A is a schematic diagram of a circuit that steers data true lines and pulls down data true lines originally coupled to failing bitlines to a known ground state according to the present invention.

FIG. 2A is a schematic diagram of a circuit that steers data true lines and pulls down data true lines originally coupled to failing bitlines to a known ground state according to the present invention. In FIG. 2A, a first switch network 155 includes a multiplicity of data true input lines 160A, switch elements 165A, latch signal lines 170, inverters 175A, AND gates 180A and N-channel field effect transistor (NFET)s 185A. There is one corresponding data true input line 160A, inverter 175A, AND gate 180A, NFET 185A and data true line 135 for each switch element 165A. Each switch element 165A can switch one data true input line 160A to one or the other of corresponding adjacent data true line 135 (see also FIG. 1). The switching of each switch element 165A is controlled by a latch signal from corresponding latch signal line 170 as indicated by L0, L1, L2 etc. Switch elements 165A may be implemented as logic circuits in which case a logical 0 on a latch signal line 170 indicates the corresponding switch element 165A should remain in its default position (as shown) DT0 to DT0, DT1 to DT1, DT2 to DT2 though DTN−1 to DTN−1. A logical 1 on first latch signal line 170 indicates a failure in a corresponding true bitline 110 (see FIG. 1) coupled to corresponding data true line 135 and that corresponding switch element 165A should switch to its replacement position (dashed lines). For example, DT0 to DT1, DT1 to DT2, DT2 to DT3 though DTN−1 to DTN if bitlines BT0 or BC0 (see FIG. 1) are defective or DT0 to DT0, DT1 to DT2, DT2 to DT3 through DTN−1 to DTN if bitlines BT1 or BC1 (see FIG. 1) are defective or DT0 to DT0, DT1 to DT1, DT2 to DT3, DT3 to DT4 (not shown) through DTN−1 to DTN if bitlines BT2 or BC2 are defective and so on. It should be pointed out, once a given latch signal line 170 is set to a logical 1, then all subsequent latch signal lines 170 are also set to logical 1. This is more fully discussed infra.

Each latch signal line 170 is coupled to the input of corresponding inverter 175A. The output of each inverter 175A is coupled to a first input of corresponding AND gate 180A. The output of each AND gate 180A is coupled to the gate of corresponding NFET 185A. Further, except for the very first latch signal line 170 (L0), the latch signal line 170 corresponding to a next switch element 165A is coupled to a second input of each AND gate 180A corresponding to a previous switch element 65A. The very first latch signal line 170 (L0) is coupled to the gate of the very first NFET 180A (T0). The source of each NFET 185A is coupled to GND and the drain of each NFET 185A is coupled to corresponding data true line 135.

When a latch signal line 170 is at a logical 0 and a previous latch signal line 170 is a logical 0 then corresponding NFET 185A is off. When a latch signal line 170 is at a logical 1 and a previous latch signal line 170 (i.e. latch line L2 and previous latch line L1) is a logical 1 then corresponding NFET 185A is off. When a latch signal line 170 is at a logical 1 and a previous latch signal line 170 is a logical 0 then corresponding NFET 185A is on. When an NFET 185A is turned on, the corresponding data true line 135 is pulled to ground, thus bringing the corresponding data true line 135 to a known state (GND). Therefore, the failing bitline has been grounded and the true input data line (and all subsequent true input data lines) switched to respective next true bitlines.

Figure 2B:
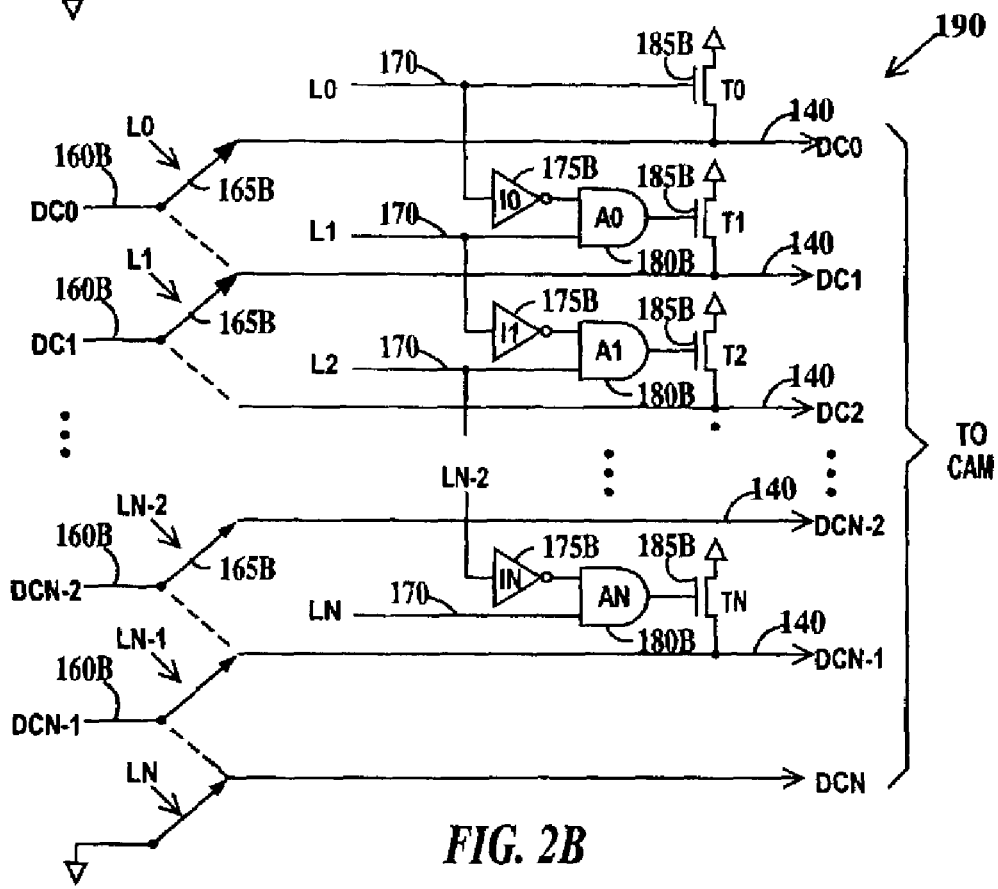
FIG. 2B is a schematic diagram of a circuit that steers data complement lines and pulls down data complement lines originally coupled to failing bitlines to a known ground state according to the present invention.

FIG. 2B is a schematic diagram of a circuit that steers data complement lines and pulls down data complement lines originally coupled to failing bitlines to a known ground state according to the present invention. In FIG. 2B, a second switch network 190 includes a multiplicity of data true complement lines 160B, switch elements 165B, latch signal lines 170, inverters 175B, AND gates 180B and N-channel field effect transistor (NFET)s 185B. There is one corresponding data true complement line 160B, inverter 175B, AND gate 180B, NFET 185A and data complement line 140 for each switch element 165B. Each switch element 165B can switch one data true complement line 160B to one or the other of corresponding adjacent data complement line 140 (see also FIG. 1). The switching of each switch element 165B is controlled by the latch signal from corresponding latch signal line 170 as indicated by L0, L1, L2 etc. Switch elements 165B may be implemented as logic circuits in which case a logical 0 on a latch signal line 170 indicates the corresponding switch element 165B should remain in its default position. Switch network 190 is similar to and operates identically to switch network 155 except that switch network 190 operates complementary input data lines and complementary bitlines.

Each latch signal line 170 is coupled to the input of corresponding inverter 175B. The output of each inverter 175B is coupled to a first input of corresponding AND gate 180B. The output of each AND gate 180B is coupled to the gate of corresponding NFET 185B. Further, except for the very first latch signal line 170 (L0), the latch signal line 170 corresponding to a next switch element 165B is coupled to a second input of each AND gate 180B corresponding to a previous switch element 165B. The very first latch signal line 170 (L0) is coupled to the gate of the very first NFET 185B (T0). The source of each NFET 185B is coupled to GND and the drain of each NFET 185B is coupled to corresponding data complement line 140.

When a latch signal line 170 is at a logical 0 and a previous latch signal line 170A is a logical 0 then corresponding NFET 185B is off. When a latch signal line 170 is at a logical 1 and a previous latch signal line 170 is a logical 1 then corresponding NFET 185B is off. When a latch signal line 170 is at a logical 1 and a previous latch signal line 170 is a logical 0 then corresponding NFET 185B is on. When an NFET 185B is turned on, the corresponding data complement line 140 is pulled to ground, thus bringing the corresponding data complement line 140 to a known state (GND). Therefore, the failing bitline has been grounded and the complement input data line (and all subsequent complement input data lines) switched to respective next true bitlines.

Figure 2C:
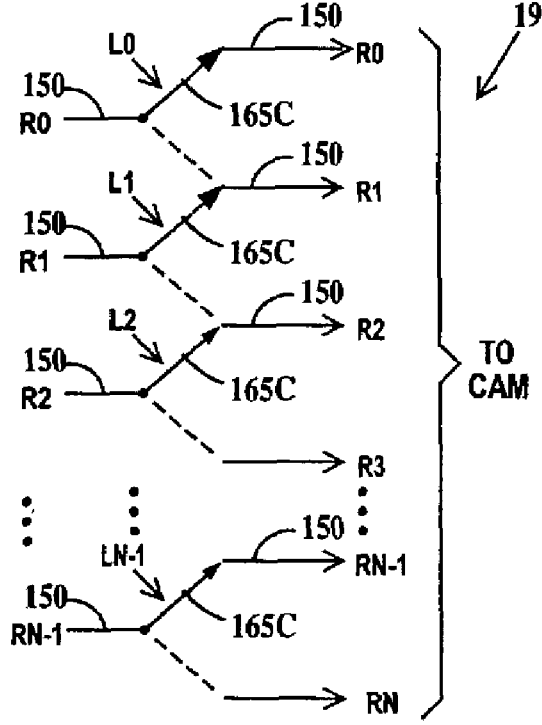
FIG. 2C is a schematic diagram of a circuit that steers read lines according to the present invention.

FIG. 2C is a schematic diagram of a circuit that steers read lines according to the present invention. In FIG. 2C, third switch network 195 includes a multiplicity of switch elements 165C. The switching of each switch element 165C is under the control of the latch signal from a corresponding latch signal line 170 (see FIGS. 2A and 2B) as indicated by L0, L1, L2 etc. Each switch has a default first position that maintains the output of corresponding sense amplifiers 145 (see FIG. 1) on the corresponding read line 150 and a second position that shifts the output of the sense amplifiers to the next adjacent read line. Switches 165C operate similarly to switches 165A and 165B of FIGS. 2A and 2B respectively.

Figure 3:
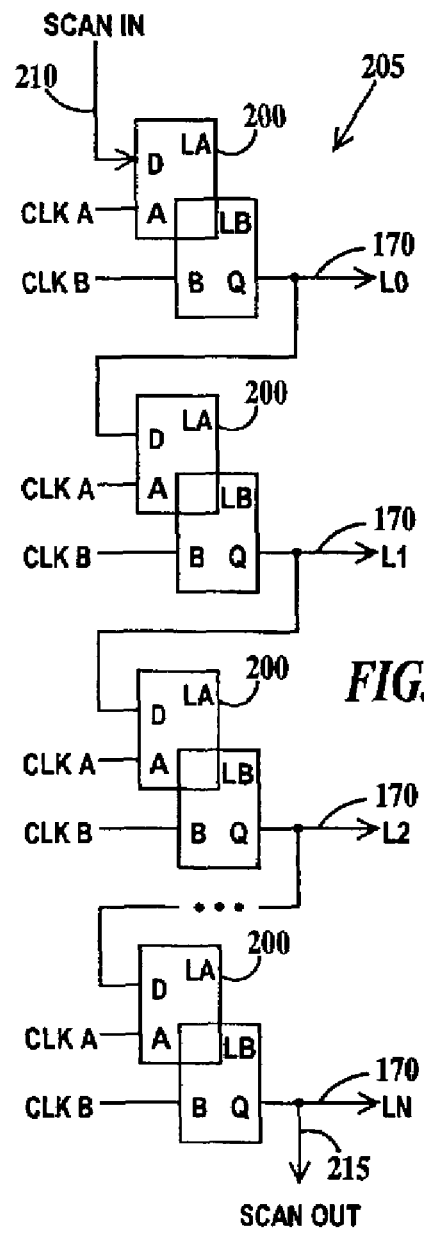
FIG. 3 is a schematic diagram of a scan in chain used to control data line and read line steering according to the present invention.

FIG. 3 is a schematic diagram of a scan in chain used to control data line and read line steering according to the present invention. In FIG. 3, a series of flip-flop latches 200 are connected in series to form a scan chain 205. Each flip-flop latch includes an "A" latch (LA) having a CLK A input and an "B" latch (LB) having a CLK B input, the CLK A and CLK signals "clocking" a SCAN IN signal on a scan in pin 210 through scan chain 205. The output of each scan latch 200 is coupled to a latch signal line 170 and the input of the next latch in scan chain 205, except the output of the last latch 200 is coupled to a SCAN OUT pin 215. There is one latch for each corresponding bitline pairs 105 (see FIG. 1). Redundancy data is scanned into scan chain 200; the redundancy data indicating which bitline pair 105 (if any) of CAM 100 (see FIG. 1) is being replaced. In one example, the source of redundancy data is fuse latches used to replace failed bitlines with redundant bitlines. Fuse latches are latches set by sensors attached to a fuse bank, the fuses of which have been "programmed" based on data obtained during a test of CAM 100.

Figure 4:
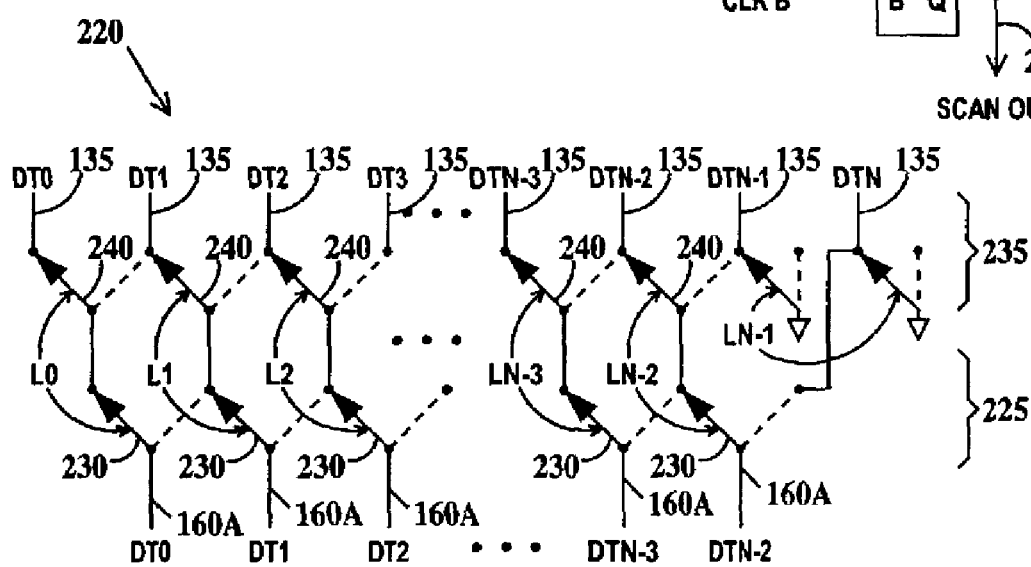
FIG. 4 is a schematic diagram illustrating a set of staged switches for steering adjacent data lines according to the present invention.

FIG. 4 is a schematic diagram illustrating a set of staged switches for steering adjacent data lines according to the present invention. In many applications, a memory cell of one bitline pair physically shares elements of a memory cell of an adjacent bitline pair. In this case, if one memory cell fails, then the second memory is likely to fail as well. Therefore, pairs of bitline pairs need to be replaced with a pair of redundant bitline pairs and data line steering needs to shift by two data lines instead of just one as illustrated in FIGS. 2A, 2B and 2C and described supra. This may be accomplished by two stage switching.

FIG. 4 illustrates switching input data true lines 160A to data true lines 135. The switching of input data complement lines 160B to data complement lines 140 or read lines 150 to read lines 150 is similar. In FIG. 4, a two-stage switch 220 includes a first bank 225 of first stage switches 230 and a second bank 235 of second stage switches 240. The input of each first stage switch 230 is a single corresponding input data true line 160A. The output of each first stage switch 230 of two-stage switch 220 can feed the input of two separate second stage switches 240. The output of each second stage switch 240 can feed two different but adjacent data true lines 135. One first stage switch 230 and a single corresponding second stage switch 240 (except for the last first stage switch 230) are controlled by the same latch signal from a corresponding latch signal line 170 (not shown) indicated by L0, L1, L2 though LN-2. LN-1 controls the last two second stage switches 240.

In an exemplary case, L0 is a logical 0, and L1 through LN-1 are logical ones, input data true line DT0 will remain coupled to data true line DT0, but input data true line DT1 will be redirected to data true line DT3, input data true line DT2 will be redirected to data true line DT4 (not shown) and so forth. The two data true lines DT1 and DT2 are no longer used and will be maintained at a known state, namely GND. Finally, it should be stated that the pull down logic and pull down NFETs illustrated in FIGS. 2A and 2B need only be included in second stage switches 240 as there is no need to pull down a data line with two devices (unless very small NFETs are used).

Figure 5:
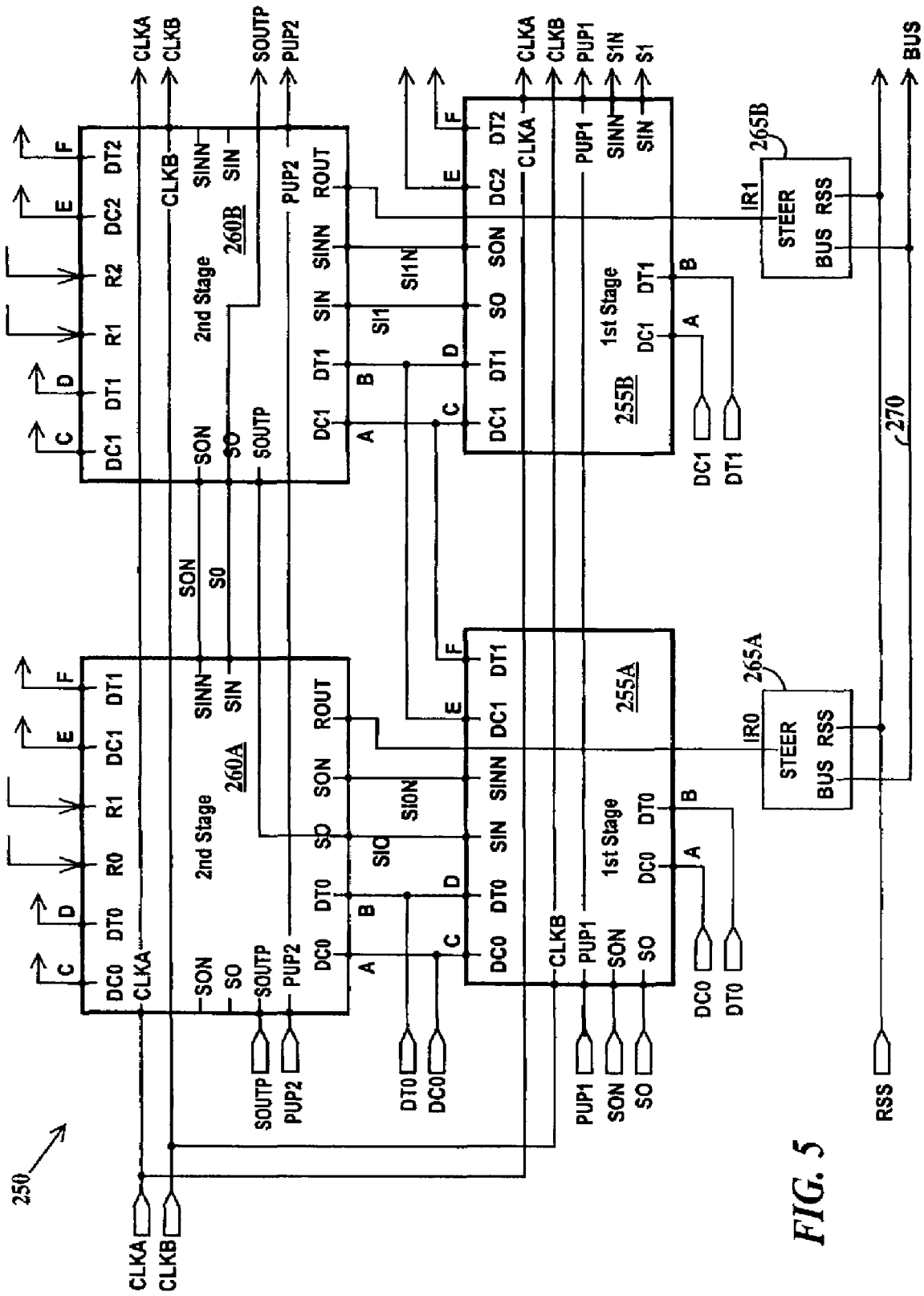
FIG. 5 is a block schematic diagram of an exemplary implementation of the present invention.

FIG. 5 is a block schematic diagram of an exemplary implementation of the present invention. In FIG. 5, a switching network 250 includes a multiplicity of first stage steering circuits 255A through 255N-2 and a multiplicity of second stage steering circuits 260A through 260N-1. Only the first two, first stage steering circuits 255A and 255B and the first two, second stage steering circuits 260A and 260B are illustrated. There are N-2 first stage steering circuits 255A through 255N-1 and N-1 second stage steering circuits 260A through 260N-1 wherein N is the number of data lines (N) outputted to the CAM from the second stage steering circuits.

Each first stage steering circuit 255A through 255N-2 receives corresponding data true and data complement signals and can switch those signals to two of four outputs. For example, first stage steering circuit 255A receives DC0 at input A and DT0 at input B and first stage. First stage steering circuit 255A can switch DC0 to output C=DC0 (default) or to output E=DC1 and DT0 to output D=DT0 (default) or to output F=DT1. Each first stage steering circuit 255A through 255N-2 receives scan in data (SIN and SINN) and transmits scan out data (SO and SON). SO, SON, SIN and SINN correspond to latch signals L0–LN illustrated in FIGS. 2A–2C and 3 and described supra. Scan data is routed in a serpentine manner. Scan data passes from first stage steering circuit 255A to second stage steering circuit 260A. From second stage steering circuit 260A the scan data passes to second stage steering circuit 260B and thence to first stage steering circuit 255B and so forth. Additionally first stage steering circuits 255A through 255N1 alternate in receiving CLK A and CLK B signals.

Each second stage steering circuit 260A through 260N-1 receives corresponding data true and data complement signals and can switch those signals to two of four outputs. For example, second stage steering circuit 260B receives DC0 or DC1 (depending on the switch state of first steering circuit 255A) at input A and DT0 or DT1 at input B (depending on the switch state of first steering circuit 255A). Second stage steering circuit 260B can switch DC0/DC1 to output C=DC1 (default) or to output E=DC2 and DT0/DT1 to output D=DT2 (default) or to output F=DC2. Each second stage steering circuit 260N through 260N-1 receives scan in data (SIN and SINN) and transmits scan out data (SO and SON). Scan data is routed in a serpentine manner as noted supra. Additionally second stage steering circuits 260A through 260N-1 alternate (oppositely from first stage steering circuits 255A through 255N1) in receiving CLK A and CLK B signals. Each second steering circuit 260A through 260N-1 receives a SOUTP signal, used to determine if a previous stage has been switched.

Each second stage steering circuit 260A through 260N-1 is coupled to two adjacent corresponding read data signals. For example second stage steering circuit 260A receives an R0 and an R1 signal and can switch either R0 to output ROUT (default) or switch R1 to output ROUT and second stage steering circuit 260B receives an R1 and an R2 signal and can switch either R1 to output ROUT (default) or switch R2 to output ROUT.

Outputs ROUT of all second stage steering circuits are coupled to corresponding buffers 265A through 265N-2, which in turn are coupled to and output bus 270. A read source select (RSS) signal controls when buffers 265A through 265N-2 are read out onto bus 270. Incidentally, instead of the individual inputs and outputs illustrated, input data signals DT0–DTN+1 and DC0–DCN+1 (the extra N=1 output is a consequence of the fan-out caused by the first stage steering circuits 255A through 255N-2) to first stage switches, 255A through 255N-2, output data signals DT0–DTN+2 and DC0–DCN+2 (the extra N=1 and N=2 outputs are a consequence of the fan-out caused by the first and second stage steering circuits 255A through 255N-2 and 260A through 260N-1) and read inputs R0-RN of second stage steering circuit 260A through 260N2 may be bussed as well.

Each first stage steering circuit 255A through 255N-2 receives a power on reset signal PUP1 and each second stage steering circuit 260A through 260N2-1 receives a power on reset signal PUP2, to reset internal latches to a known state, which set the internal switches.

The outputs C and D of each first stage steering circuit 255A through 255N-2 are coupled to the A and B inputs respectively of corresponding second stage steering circuits 260A through 260N-1. Note that DC0 and DT0 are coupled to inputs A and B of first second stage steering circuit 260A. Finally, it should be noted that outputs E and F of previous first stage steering circuits 255A through 255N-2 are coupled respectively to outputs C and D of the immediately subsequent steering circuit 255A through 255N-2.

Figure 6:
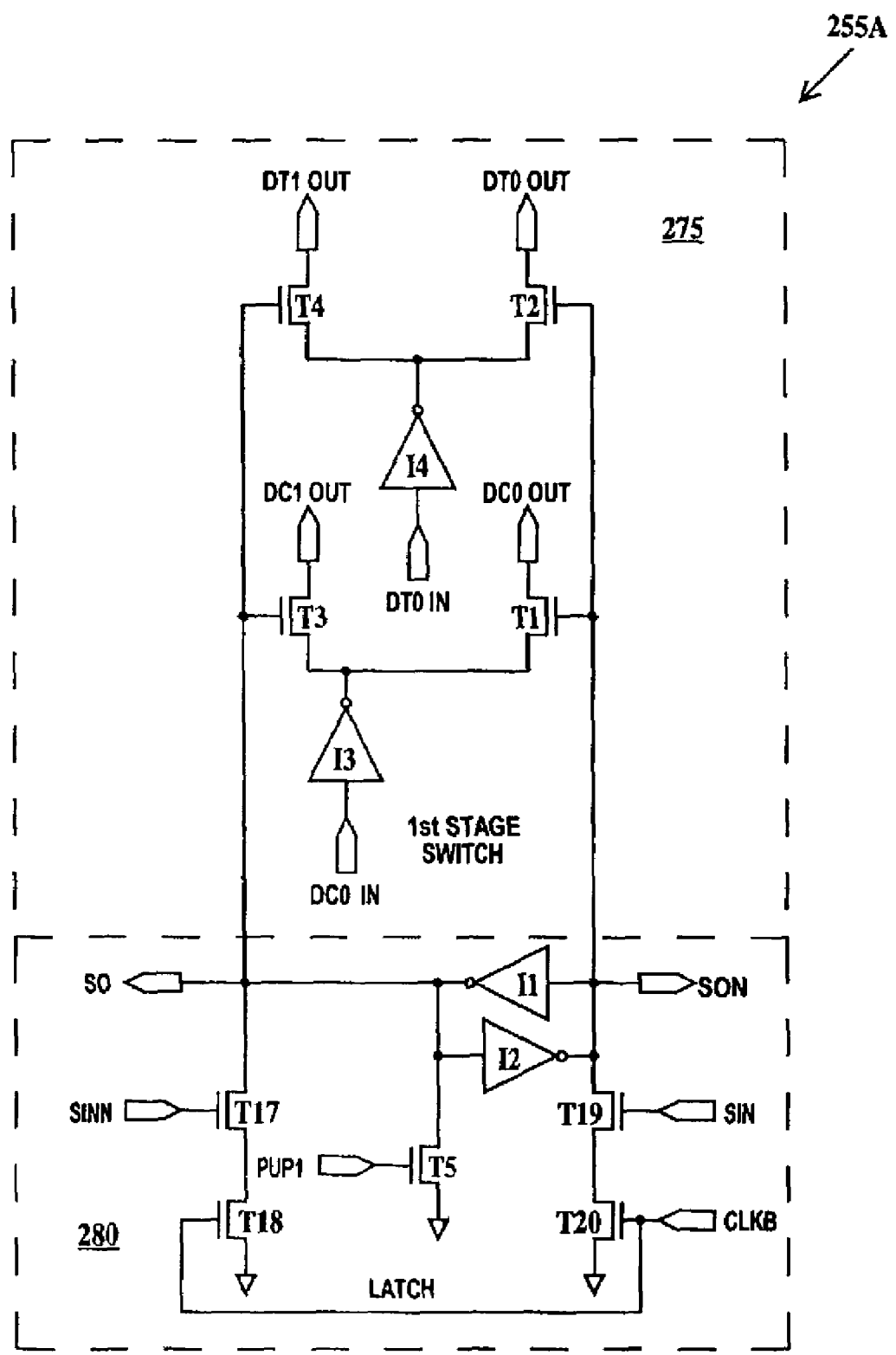
FIG. 6 is a schematic diagram of an exemplary first stage steering circuit of FIG. 5.

FIG. 6 is a schematic diagram of an exemplary first stage steering circuit of FIG. 5. In FIG. 6, first stage steering circuit 255A includes a switch section 275 and a latch section 280. The steering latch formed by inverters I1 and I2 latch the value(s) of scan signals SIN and SINN. If a 0 is latched (no fail on bitline 0 of the CAM) NFETs T1 and T2 turn on and NFETs T3 and T4 turn off thus coupling input DC0 IN to output DC0 OUT and coupling input DT0 IN to output DT0 OUT. If a 1 is latched (a fail on bitline 0 of the CAM) NFETs T1 and T2 turn off and NFETs T3 and T4 turn on thus coupling input DC0 IN to output DC1 OUT and coupling input DT0 IN to output DT1 OUT. A high on PUP1 resets the contents of the steering latch formed by inverters I1 and I2 to 0.

Figure 7:
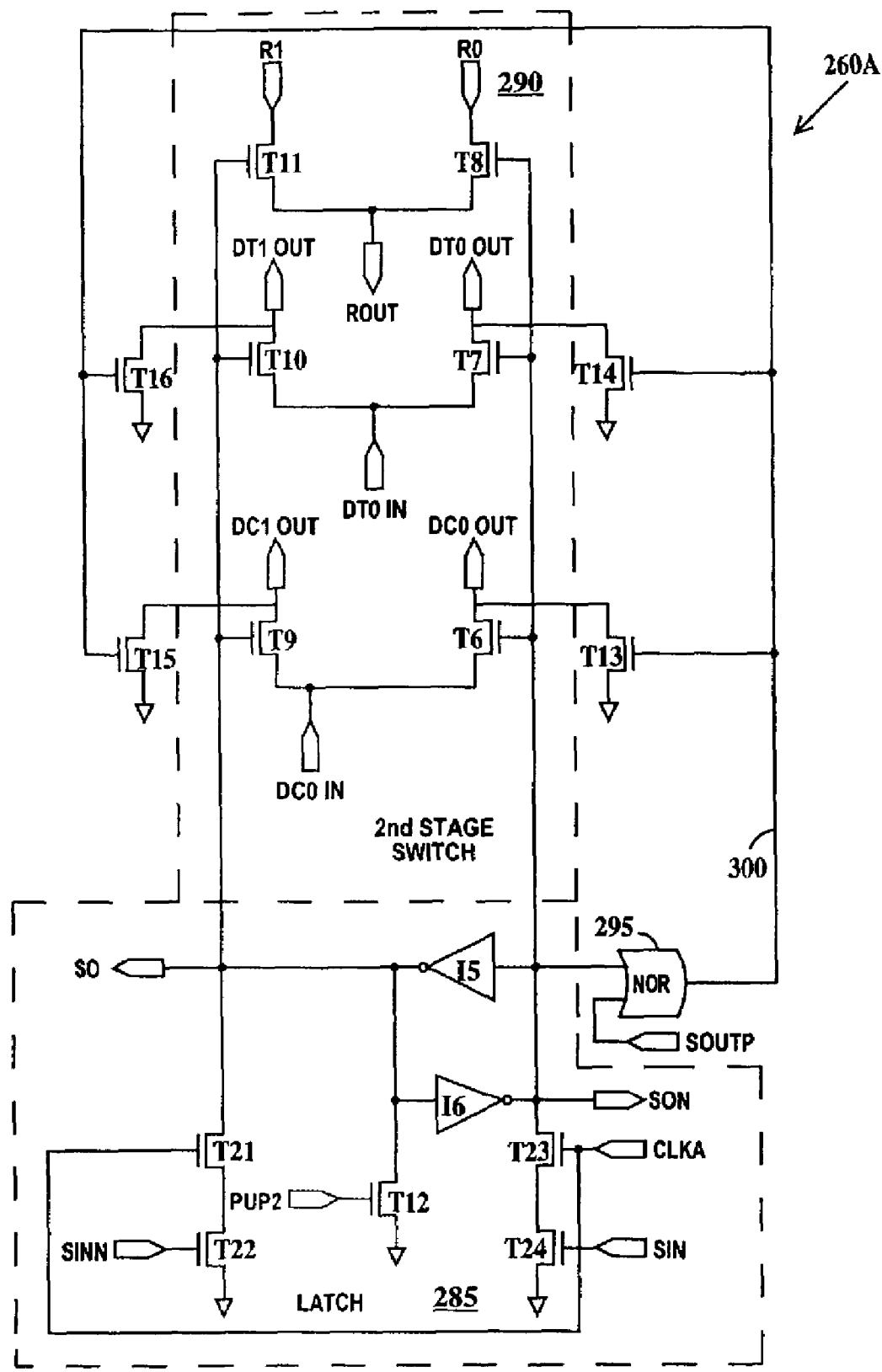
FIG. 7 is a schematic diagram of an exemplary second stage steering circuit of FIG. 5.

FIG. 7 is a schematic diagram of an exemplary second stage steering circuit of FIG. 5. In FIG. 7, second stage steering circuit 260A includes a switch section 290 and a latch section 285. The steering latch formed by latches 15 and 16 latch the value(s) of scan signals SIN and SINN. If a 0 is latched (no fail on bitline 0 of the CAM) NFETs T6, T7 and T8 turn on and NFETs T9, T10 and T11 turn off thus coupling input DC0 IN to output DC0 OUT, coupling input DT0 IN to output DT0 OUT and coupling input R0 to output ROUT. If a 1 is latched (a fail on bitline 0 of the CAM) NFETs T6, T7 and T8 turn off and NFETs T9, T10 and T11 turn on thus coupling input DC0 to output DC1, coupling input DT0 to output DT1 and coupling input R1 to output ROUT. A high on PUP2 resets the contents of the steering latch formed by inverters I5 and I6 to 0.

Also note that with NFETs T6 and T7 on NFETs T13 and T14 will respectively pull DC0 and DT0 to GND (a known state) and with NFETs T9 and T10, NFETs T15 and T16 will respectfully pull DC1 and DT1 to GND (a known state) provided that the output (pull down line 300) of NOR gate 295 is a high. A first input of NOR gate 295 is coupled to the latch formed by inverters I5 and I6 and a second input of NOR gate 295 is coupled to a SOUTP input. SOUTP is normally derived from the state of the steering latch of the immediately previous second stage steering circuit. (For second stage steering circuit 260A, SOUTP is set to 0).

For the case of all 0's in scan string (Good data line before the switch). If the steering latch in the current second stage steering circuit has SO scanned to a 0 and the steering latch of the immediately previous steering latch is a 0, then NFETs T13, T14, T15 and T16 are off as pull down line 300 is 0.

For the case of 0's followed by 1's in scan string (Bad data line before the switch). If the steering latch in the current second stage steering circuit has SO scanned to a 1 and the steering latch of the immediately previous steering latch is a 0, then NFETs T13, T14, T15 and T16 are on as pull down line 300 is 1.

For the case of all 1's in scan string (Good data line after the switch). If the steering latch in the current second stage steering circuit has SO scanned to a 1 and the steering latch of the immediately previous steering latch is a 1, then NFETs T13, T14, T15 and T16 are off as pull down line 300 is 0.

Therefore, the present invention while replacing defective bitlines overcomes the problem of floating data lines by forcing replaced data lines to a known state.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example the replacement of bitlines has been described at a 0.1 scan boundary but a circuit could be devised that would switch at a 1 0 scan boundary. It is possible to have one set of switches switch at 0 1 boundaries and another set of switches switch at 1 0 boundaries after the first set of switches has been activated. The present invention is described using a CAM as an exemplary memory device, however the invention is not limited to CAMs but is extendable to any memory array device using bitlines such as DRAMs. Further the CAM device illustrated has shared search and bit lines. It is very easy to extend the invention to CAM devices having separate search and bitlines by switching out and grounding the corresponding search line when a bitline is switched out. Therefore, it is intended that the following claims cover all such modifications and changes as fall within the true spirit and scope of the invention.

What is claimed is:

1. An integrated circuit comprising:
    a set of bitlines;
    a set of data lines;
    a coupling circuit that directly connects each respective data line to a first respective bitline or to a second respective bitline based on a steering signal, said second respective bitline being adjacent to said first respective bitline; and
    a circuit that maintains said first respective bitline at a desired potential after said data line is coupled to said second bitline.

2. The integrated circuit of claim 1, wherein said first respective bitline maintained at said desired potential is a failed bitline.

3. The integrated circuit of claim 1, wherein said desired potential is ground.

4. The integrated circuit of claim 1, wherein said data lines transfer data in parallel to said bitlines and said bitlines are coupled in parallel to one or more memory cells.

5. The integrated circuit of claim 1, wherein all said data lines in said set of data lines are arranged in a serial order and further including:

means for coupling each data line, after said data that has been coupled to said second respective bitline, to corresponding respective second bitlines.

6. The integrated circuit of claim 1, wherein said steering signal indicates which bitlines of said set of bitlines are failed bitlines.

7. The integrated circuit of claim 1, wherein said coupling circuit includes a latch stage connected to a switch stage.

8. The integrated circuit of claim 1, wherein a number of said bitlines in said set of bitlines exceeds a number of data lines in said set of data lines.

9. The integrated circuit of claim 8, wherein each said data line is connected to only one of said bitlines and each data line is connected to a different bitline.

10. The integrated circuit of claim 1, further including an additional coupling circuit that disconnects each respective data line connected to a second respective bitline by said coupling circuit from said second respective bitline and directly connects each respective data line to a third respective bitline based on said steering signal, said third respective bitline adjacent to said second respective bitline, said additional coupling circuit connected between said coupling circuit and said set of bitlines.

11. The integrated circuit of claim 10, wherein said coupling circuit includes a first latch stage connected to a first switch stage and said additional coupling circuit includes a second latch stage connected to a second switch stage.

12. A method of replacing, in an integrated circuit having a multiplicity of data lines and a multiplicity of bitlines, a first bitline wit a second bitline comprising:

providing a set of said multiplicity of said bitlines;
providing a set of said multiplicity of said data lines;
connecting each respective data line to a first respective bitline or to a second respective bitline through a switch and based on a steering signal supplied to said switch, said second respective bitline being adjacent to said first respective bitline; and
maintaining said first respective bitline at a desired potential after said data line is coupled to said second bitline.

13. The method of claim 12, wherein said first respective bitline maintained at said desired potential is a failed bitline.

14. The method of claim 12, wherein said desired potential is ground.

15. The method of claim 12, wherein said data lines transfer data in parallel to said bitlines and said bitlines are coupled in parallel to one or more memory cells.

16. The method of 12 wherein all said data lines in said set of data lines are arranged in a serial order and further including:

connecting each data line, after said data that has been connected to said second respective bitline, to corresponding respective second bitlines.

17. The method of claim 12, wherein said steering signal indicates which bitlines of said set of bitlines are failed bitlines.

18. The method circuit of claim 12, wherein said coupling circuit includes a latch stage connected to a switch stage.

19. The method of claim 12, wherein a number of said bitlines in said set of bitlines exceeds a number of data lines in said set of data lines.

20. The method of claim 19, wherein each said data line is connected to only one said bitlines and each said data line is connected to a different bitline.

21. The method of claim 12, further including providing an additional coupling, said additional coupling circuit disconnecting each respective data line connected to a second respective bitline by said coupling circuit from said second respective bitline and directly connecting each respective data line to a third respective bitline based on said steering signal, said third respective bitline adjacent to said second respective bitline, said additional coupling circuit connected between said coupling circuit and said set of bitlines.

22. The method of claim 21, wherein said coupling circuit includes a first latch stage connected to a first switch stage and said additional coupling circuit includes a second latch stage connected to a second switch stage.

23. A content addressable memory comprising:

a set of bitlines;
a set of data lines, a number of said data lines less than a number of said bitlines;
a set of read lines, a number of said read lines equal to said number of said data lines, each said read line coupled to one corresponding bitline of said set of bitlines;
means for directly connecting each respective data line to a first-respective bitline or to a second respective bitline based on a steering signal, said second respective bitline being adjacent to said first respective bitline;
means for coupling each respective read line to a first respective read line or to a second respective read line based on said steering signal, said second respective read line being adjacent to said first respective read line; and
means for maintaining said first respective bitline at a known fixed state after said data line is connected to said second respective bitline.

24. The content addressable memory of claim 23, wherein all said data lines in said set of data lines are arranged in a serial order and all said read lines in said set of read lines are arranged in a serial order and further including:

means for directly connecting each respective data line, after said respective data line has been connected to said second respective bitline, to a corresponding third respective bitline, said third respective bitline immediately adjacent to said second respective bitline; and
means for directly connecting each respective read line, after said respective read line has been connected to said second respective read line, to a third respective read line, said third respective read line immediately adjacent to said second respective read line.

25. The content addressable memory of claim 23, further including:

one or none bitlines between said first respective bitline and said second respective bitline; and
one or none read lines between said first respective read line and said second respective read line.

26. The content addressable memory of claim 23, wherein said steering signal indicates which bitlines of said set of bitlines are failed bitlines and is derived from fuse latches.

* * * * *

UNITED STATES PATENT AND TRADEMARK OFFICE
CERTIFICATE OF CORRECTION

PATENT NO. : 7,117,400 B2 Page 1 of 1
APPLICATION NO. : 10/065723
DATED : October 3, 2006
INVENTOR(S) : Batson et al.

It is certified that error appears in the above-identified patent and that said Letters Patent is hereby corrected as shown below:

Column 10
Line 2, delete "one said bitlines" and insert -- one of said bitlines --

Signed and Sealed this

Fifth Day of December, 2006

JON W. DUDAS
*Director of the United States Patent and Trademark Office*